(12) United States Patent
Park et al.

(10) Patent No.: US 12,490,553 B2
(45) Date of Patent: Dec. 2, 2025

(54) ULTRAVIOLET LIGHT EMITTING DIODE

(71) Applicant: SEOUL VIOSYS CO., LTD., Ansan-si (KR)

(72) Inventors: Ju Yong Park, Ansan-si (KR); Seong Gyu Jang, Ansan-si (KR); Kyu Ho Lee, Ansan-si (KR); Joon Hee Lee, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 18/230,616

(22) Filed: Aug. 4, 2023

(65) Prior Publication Data
US 2023/0395752 A1 Dec. 7, 2023

Related U.S. Application Data

(60) Continuation of application No. 17/099,499, filed on Nov. 16, 2020, now Pat. No. 11,749,780, which is a
(Continued)

(30) Foreign Application Priority Data

Jul. 15, 2016 (KR) .......................... 10-2016-0090201

(51) Int. Cl.
*H10H 20/831* (2025.01)
*H10H 20/80* (2025.01)
(Continued)

(52) U.S. Cl.
CPC .......... *H10H 20/831* (2025.01); *H10H 20/80* (2025.01); *H10H 20/821* (2025.01); *H10H 20/857* (2025.01)

(58) Field of Classification Search
CPC .... H10H 20/831; H10H 20/80; H10H 20/821; H10H 20/857; H10H 20/819;
(Continued)

(56) References Cited

U.S. PATENT DOCUMENTS 6,455,878 B1   9/2002 Bhat et al.
8,207,543 B2   6/2012 Hasnain
(Continued)

FOREIGN PATENT DOCUMENTS

JP   2003-031858    1/2003
KR   10-0649768    11/2006
(Continued)

OTHER PUBLICATIONS

International Search Report dated Oct. 18, 2017, issued in International Application No. PCT/KR2017/007286.
(Continued)

*Primary Examiner* — Su C Kim
(74) *Attorney, Agent, or Firm* — Oblon, McClelland, Maier & Neustadt, L.L.P.

(57) ABSTRACT

An ultraviolet light-emitting diode includes: a substrate; an n-type semiconductor layer disposed on the substrate; a mesa disposed on the n-type semiconductor layer and including an active layer and a p-type semiconductor layer; an n-ohmic contact layer contacting the n-type semiconductor layer; a p-ohmic contact layer contacting the p-type semiconductor layer; an n-bump electrically connected to the n-ohmic contact layer; and a p-bump electrically connected to the p-ohmic contact layer, wherein the mesa includes a plurality of branches, the n-ohmic contact layer surrounds the mesa and is disposed in a region between the branches, each of the n-bump and the p-bump covers an upper surface and a side surface of the mesa, and the p-bump covers at least two of the branches among the plurality of branches. Therefore, an optical output can be increased by reducing light loss, and a forward voltage can be lowered.

20 Claims, 6 Drawing Sheets

Related U.S. Application Data division of application No. 16/246,565, filed on Jan. 14, 2019, now Pat. No. 10,868,215, which is a continuation of application No. PCT/KR2017/007286, filed on Jul. 7, 2017.

(51) Int. Cl.
  *H10H 20/821* (2025.01)
  *H10H 20/857* (2025.01)

(58) Field of Classification Search
  CPC .............. H10H 20/8312; H10H 20/84; H10H 20/8314; H10H 20/81; H01L 2924/12041
  See application file for complete search history.

(56) References Cited

U.S. PATENT DOCUMENTS

| | | |
|---|---|---|
| 9,391,238 B2 | 7/2016 | Kim et al. |
| 2005/0133806 A1 | 6/2005 | Peng et al. |
| 2008/0210957 A1 | 9/2008 | Watanabe et al. |
| 2009/0283787 A1* | 11/2009 | Donofrio .............. H01L 33/405 257/E33.068 |
| 2014/0209955 A1 | 7/2014 | Kim et al. |
| 2014/0353708 A1* | 12/2014 | Seo ........................ H01L 33/58 257/98 |

FOREIGN PATENT DOCUMENTS

| | | |
|---|---|---|
| KR | 10-2012-0059859 | 6/2012 |
| KR | 10-2013-0030178 | 3/2013 |
| KR | 10-2014-0096920 | 8/2014 |

OTHER PUBLICATIONS

Notice of Allowance dated Jan. 14, 2019, issued in U.S. Appl. No. 16/246,565.

Notice of Allowance dated Apr. 28, 2023, issued in U.S. Appl. No. 17/099,499.

* cited by examiner

ULTRAVIOLET LIGHT EMITTING DIODE

CROSS REFERENCE TO RELATED APPLICATION

This application is a Continuation of U.S. patent application Ser. No. 17/099,499, filed Nov. 16, 2020, which is a Division of U.S. patent application Ser. No. 16/246,565, filed on Jan. 14, 2019, now issued as U.S. Pat. No. 10,868, 215, which is a Bypass Continuation of International Patent Application No. PCT/KR2017/007286, filed on Jul. 7, 2017, and claims priority from and the benefit of Korean Patent Application No. 10-2016-0090201, filed on Jul. 15, 2016, all of which are hereby incorporated by reference for all purposes as if fully set forth herein.

BACKGROUND

Field

Exemplary embodiments of the inventive concepts relate generally to an inorganic semiconductor light emitting diode, and more specifically, to a light emitting diode emitting deep-ultraviolet (UV) light having a wavelength of 300 nm or less.

Discussion of the Background

In general, a light emitting diode configured to emit UV light having a wavelength of 200 nm to 300 nm can be used in various applications including a sterilization apparatus, a water or air purifier, a high-density optical recording device, a light source for bio-aerosol fluorescent detection systems, and the like.

Unlike near-UV or blue light emitting diodes, a light emitting diode emitting relatively deep-UV light includes a well layer containing Al, like an AlGaN layer. Due to such a composition of a GaN-based semiconductor layer, the deep-UV light emitting diode has a substantially different structure from the blue light emitting diode or the near-UV light emitting diode.

In particular, a typical deep-UV light emitting diode has a different structure from a typical blue light emitting diode or a typical near-UV light emitting diode in terms of the shape and location of a mesa on an n-type semiconductor layer. That is, the mesa is biased from the center of the n-type semiconductor layer to one side thereof on the n-type semiconductor layer, a p-bump is formed on the mesa, and an n-bump is disposed near the other side of the n-type semiconductor layer to be spaced apart from the mesa. In addition, such a conventional UV light emitting diode is bonded to a submount by a thermal sonic (TS) bonding technique. For TS bonding, the n-bump and the p-bump are required to have upper surfaces flush with each other. To this end, a step adjustment layer is disposed under the n-bump.

Such a conventional UV light emitting diode generally has disadvantages of low power output and high forward voltage. In particular, since the p-type semiconductor layer includes a p-type GaN layer for ohmic contact, UV light entering the p-type semiconductor layer is absorbed and lost by the p-type semiconductor layer. In addition, since an n-type ohmic contact layer bonded to the n-type semiconductor layer absorbs light, light traveling towards the n-type ohmic contact layer is absorbed and lost by the n-type ohmic contact layer. In the blue light emitting diode, a reflective metal layer is adopted as the n-type ohmic contact layer to reduce light loss, whereas, in the deep-UV light emitting diode, the n-type ohmic contact layer is not likely to be formed of a reflective metal layer and occupies a relatively large area, thereby causing significant problems.

Moreover, since the typical UV light emitting diode does not allow use of light emitted through a side surface of the mesa, the typical UV light emitting diode tends to reduce the side surface of the mesa as much as possible. That is, in the typical UV light emitting diode, the mesa is formed to have a relatively large width. However, a distance from the n-type ohmic contact layer to a central region of the mesa increases with increasing width of the mesa, thereby causing inefficient current spreading and high forward voltage.

The above information disclosed in this Background section is only for understanding of the background of the inventive concepts, and, therefore, it may contain information that does not constitute prior art.

SUMMARY

Exemplary embodiments of the inventive concepts provide a UV light emitting diode having a novel structure capable of improving electrical characteristics and/or light output.

Additional features of the inventive concepts will be set forth in the description which follows, and in part will be apparent from the description, or may be learned by practice of the inventive concepts.

In accordance with one exemplary embodiment of the inventive concepts, a UV light emitting diode includes: a substrate; an n-type semiconductor layer disposed on the substrate; a mesa disposed on the n-type semiconductor layer and including an active layer and a p-type semiconductor layer; an n-ohmic contact layer contacting the n-type semiconductor layer; a p-ohmic contact layer contacting the p-type semiconductor layer; an n-bump electrically connected to the n-ohmic contact layer; and a p-bump electrically connected to the p-ohmic contact layer, wherein the mesa includes a main branch and a plurality of sub-branches extending from the main branch; the n-ohmic contact layer surrounds the mesa and is disposed in a region between the sub-branches; and each of the n-bump and the p-bump covers upper and side surfaces of the mesa.

In accordance with another exemplary embodiment of the inventive concepts, a UV light emitting diode includes: a substrate; an n-type semiconductor layer disposed on the substrate; a mesa disposed on the n-type semiconductor layer and including an active layer and a p-type semiconductor layer; an n-ohmic contact layer contacting the n-type semiconductor layer; a p-ohmic contact layer contacting the p-type semiconductor layer; an n-bump electrically connected to the n-ohmic contact layer; and a p-bump electrically connected to the p-ohmic contact layer, wherein the mesa includes a plurality of branches; the n-ohmic contact layer surrounds the mesa and is disposed in a region between the branches; and each of the n-bump and the p-bump covers upper and side surfaces of the mesa, the p-bump covering at least two of the branches among the plurality of branches.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION OF THE ILLUSTRATED EMBODIMENTS

Figure 1:
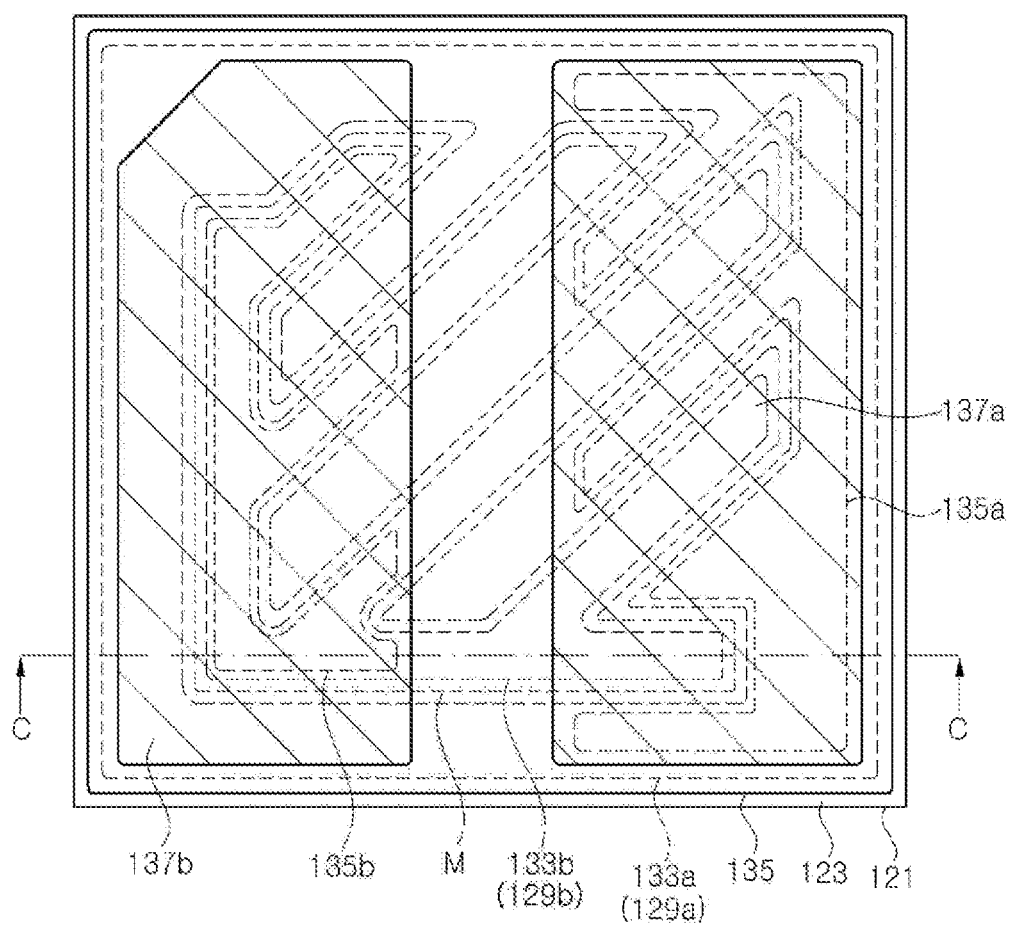
FIG. 1 is a plan view of a UV light emitting diode according to one exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

In general, nitride semiconductors described below may be grown by various methods well-known to those skilled in the art. For example, the nitride semiconductors may be grown by metal organic chemical vapor deposition (MOCVD), molecular beam epitaxy (MBE), hydride vapor phase epitaxy (HVPE), or others. In the following exemplary embodiments, semiconductor layers will be described as being grown in a growth chamber by MOCVD. During growth of nitride semiconductors, sources introduced into a chamber may be selected from sources known to those skilled in the art, for example, TMGa, TEGa, or others as Ga sources, TMAl, TEAl, or others as Al sources, TMIn, TEIn, or others as In sources, and $NH_3$ as a N source, without being limited thereto.

In accordance with one exemplary embodiment of the inventive concepts, a UV light emitting diode includes: a substrate; an n-type semiconductor layer disposed on the substrate; a mesa disposed on the n-type semiconductor layer and including an active layer and a p-type semiconductor layer; an n-ohmic contact layer contacting the n-type semiconductor layer; a p-ohmic contact layer contacting the p-type semiconductor layer; an n-bump electrically connected to the n-ohmic contact layer; and a p-bump electrically connected to the p-ohmic contact layer, wherein the mesa includes a main branch and a plurality of sub-branches extending from the main branch; the n-ohmic contact layer surrounds the mesa and is disposed in a region between the sub-branches; and each of the n-bump and the p-bump covers upper and side surfaces of the mesa.

In a typical UV light emitting diode, the p-bump is disposed on the mesa and thus cannot reflect light emitted through the side surface of the mesa. On the contrary, according to exemplary embodiments of the inventive concepts, the side surface of the mesa is partially covered by the n-bump and the p-bump, which reflect UV light emitted through the side surface of the mesa to reenter the substrate.

In addition, since the mesa is disposed not only under the p-bump but also under the n-bump, the mesa can be distributed over a broad region of the substrate.

Further, according to the exemplary embodiments, since the mesa includes a main branch and sub-branches, the side surface of the mesa can have an increased surface area. Accordingly, a region between the mesa and an n-ohmic contact layer is increased to allow UV light emitted through the side surface of the mesa to reenter the substrate through this region, thereby improving light output.

On the other hand, a minimum width of the n-type semiconductor layer exposed between the sub-branches may be greater than or equal to a minimum width of the sub-branches. In a typical UV light emitting diode, the mesa is generally formed to have a greater width than the exposed n-type semiconductor layer, whereas the mesa of the light emitting diode according to the exemplary embodiments is formed to have a narrower width. Accordingly, the light emitting diode according to the exemplary embodiments allows easy current spreading inside the mesa and can further reduce forward voltage.

In some exemplary embodiments, the main branch may have a greater minimum width than the sub-branches. However, it should be understood that the inventive concepts is not limited thereto. Alternatively, the main branch may have the same width as the sub-branches or may have a smaller width than the sub-branches.

The main branch may include a first main branch extending along one side edge of the substrate and a second main branch extending along another side edge of the substrate adjacent to the one side edge of the substrate, and the sub-branches may include sub-branches extending from the first main branch and sub-branches extending from the second main branch.

Herein, the term "main branch" means a branch having a plurality of branches branched off from points between opposite ends thereof, and the term "sub-branch" means a branch connected at one end thereof to the main branch and having the other end in a free standing state (that is, a free end). In addition, when the mesa has two distal ends, the mesa can be referred to as having a single branch, and when the mesa has at least three distal ends, the mesa can be referred to as having a "plurality of branches".

The sub-branches may be parallel to each other. In addition, the sub-branches branch off from the same side surface of the main branch.

The sub-branches may be parallel to a diagonal line of the substrate.

The sub-branches may have different lengths. Thus, the mesa can be disposed over a broad region of the substrate through adjustment of the lengths of the sub-branches.

The substrate may have a rectangular shape having four edges and the shortest distance from each edge to the mesa may be smaller than half the shortest distance from each edge to a center of the substrate. In a typical UV light emitting diode, the mesa is biased toward one side of the substrate, whereas the UV light emitting diode according to the exemplary embodiments include the mesa broadly disposed in a central region of the substrate.

The UV light emitting diode may further include an n-pad metal layer covering the n-ohmic contact layer and a p-pad metal layer covering the p-ohmic contact layer, wherein the n-bump and the p-bump may be connected to the n-pad metal layer and the p-pad metal layer, respectively.

In some exemplary embodiments, the n-ohmic contact layer may be a metal alloy layer including Cr, Ti, Al and Au; the n-pad metal layer may include a Ti layer/Au layer/Ti layer; and the n-pad metal layer may adjoin the n-ohmic contact layer.

The UV light emitting diode may further include an insulation layer interposed between the n-pad metal layer and the p-pad metal layer and between the n-bump and the p-bump and having openings exposing the n-pad metal layer and the p-pad metal layer. The insulation layer may be composed of, for example, an $SiO_2$ single layer or multiple layers. The insulation layer may be a distributed Bragg reflector in which insulation layers having difference indices of refraction are alternately stacked one above another.

The openings are shielded by the n-bump and the p-bump, respectively. Accordingly, the n-pad metal layer and the p-pad metal layer exposed through the openings may be covered by the n-bump and the p-bump to be protected from an external environment.

A separation distance between the n-ohmic contact layer and the mesa may be constant. However, it should be understood that the inventive concepts is not limited thereto and the separation distance may be adjusted depending upon locations thereof.

The n-bump and the p-bump may be disposed parallel to each other.

In one embodiment, the mesa may include protrusions formed on the side surface thereof. The protrusions further increase the surface area of the side surface of the mesa. In addition, the n-ohmic contact layer may be separated a constant distance from the mesa along the side surface of the mesa. Accordingly, the n-ohmic contact layer may be disposed along the contour of the protrusions on the side surface of the mesa, thereby increasing the overall area of a region between the n-ohmic contact layer and the mesa.

In accordance with another exemplary embodiment of the inventive concepts, a UV light emitting diode includes: a substrate; an n-type semiconductor layer disposed on the substrate; a mesa disposed on the n-type semiconductor layer and including an active layer and a p-type semiconductor layer; an n-ohmic contact layer contacting the n-type semiconductor layer; a p-ohmic contact layer contacting the p-type semiconductor layer; an n-bump electrically connected to the n-ohmic contact layer; and a p-bump electrically connected to the p-ohmic contact layer, wherein the mesa includes a plurality of branches; the n-ohmic contact layer surrounds the mesa and is disposed in a region between the branches; and each of the n-bump and the p-bump covers upper and side surfaces of the mesa, the p-bump covering at least two of the branches among the plurality of branches.

The branches may include a main branch and a plurality of sub-branches extending from the main branch.

The main branch may include a first main branch extending along one side edge of the substrate and a second main branch orthogonal to the first main branch.

The p-bump may completely cover the first main branch and may partially cover the second main branch. Some of the sub-branches may be separated from the p-bump to partially overlap the n-bump.

Hereinafter, exemplary embodiments of the inventive concepts will be described with reference to the accompanying drawings.

Figure 2A:
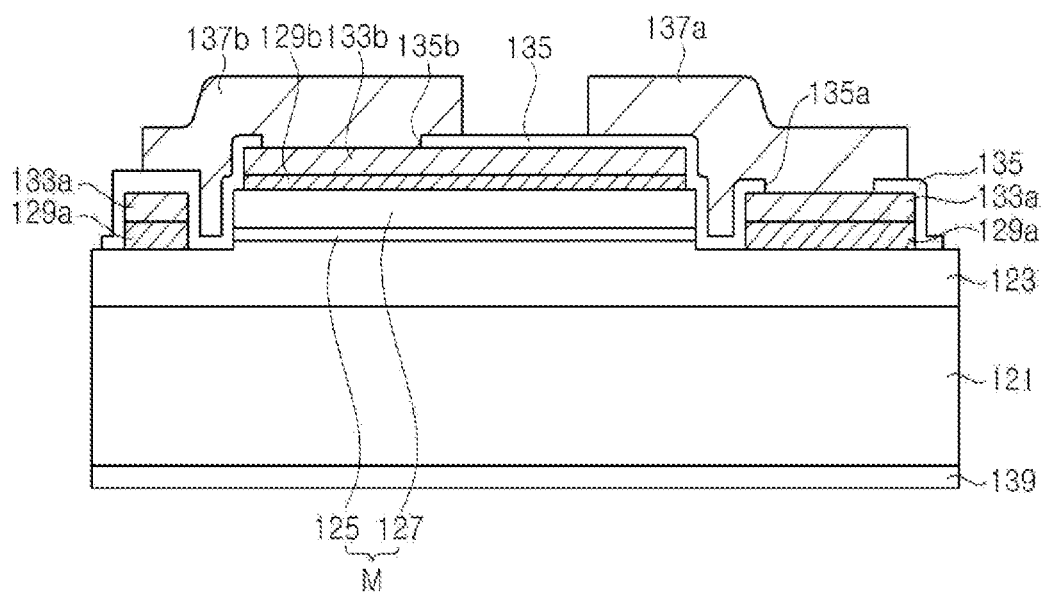
FIG. 2A and FIG. 2B show a cross-sectional view taken along line C-C of FIG. 1.
Figure 2B:
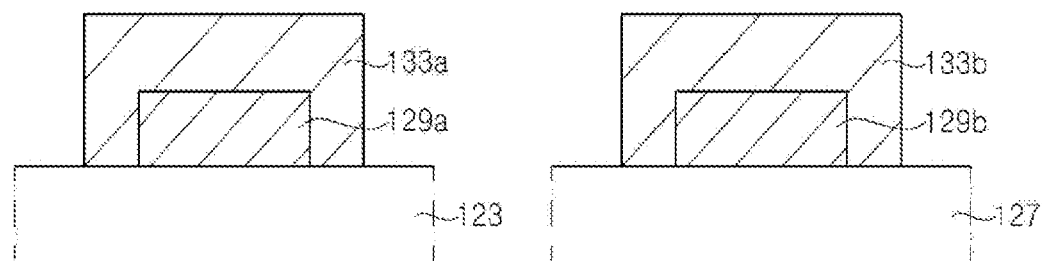
Figure 3:
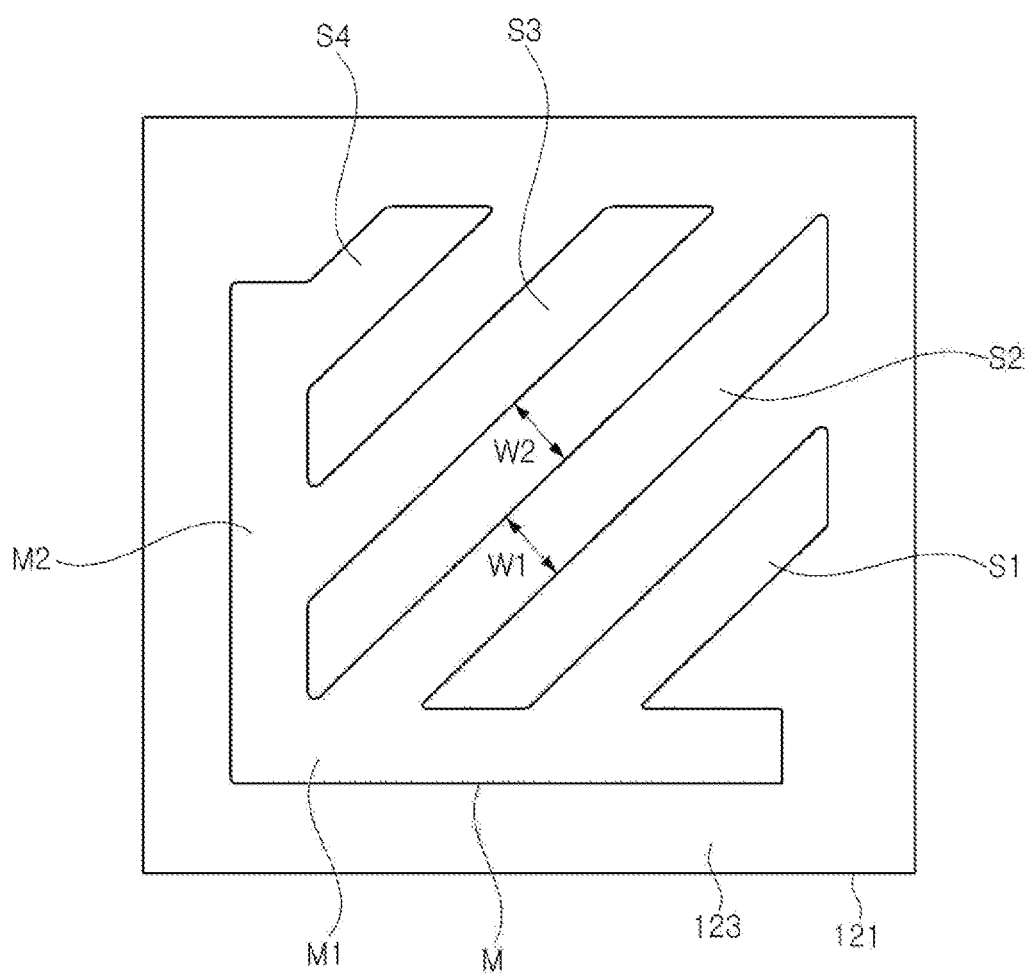
FIG. 3 is a schematic plan view of a mesa according to one exemplary embodiment.

FIG. 1 is a plan view of a UV light emitting diode according to one exemplary embodiment of the inventive concepts and FIGS. 2A and 2B show a cross-sectional view taken along line C-C of FIG. 1. FIG. 3 is a schematic plan view of a mesa according to one exemplary embodiment of the inventive concepts.

Referring to FIG. 1, FIGS. 2A and 2B, and FIG. 3, a UV light emitting diode according to one exemplary embodiment of the inventive concepts includes a substrate 121, an n-type semiconductor layer 123, an active layer 125, a p-type semiconductor layer 127, an n-ohmic contact layer 129*a*, a p-ohmic contact layer 129*b*, an n-pad metal layer 133*a*, a p-pad metal layer 133*b*, an insulation layer 135, an n-bump 137*a*, a p-bump 137*b*, and an anti-reflection layer 139.

The substrate 121 may be selected from any substrates that allow growth of nitride semiconductor layers thereon, and may include, for example, a heterogeneous substrate, such as a sapphire substrate, a silicon substrate, a silicon carbide substrate, and a spinel substrate, or a homogeneous substrate, such as a GaN substrate and an AlN substrate.

The n-type semiconductor layer 123 is disposed on the substrate 121. The n-type semiconductor layer 123 may include, for example, an AlN buffer layer (about 3.79 µm) and an n-type AlGaN layer. The n-type AlGaN layer may include a lower n-type AlGaN layer (about 2.15 µm) having an Al molar ratio of 0.8 or more, an intermediate AlGaN layer (about 1.7 nm) having an Al molar ratio of 0.7 to 0.8, and an upper n-type AlGaN layer having a thickness of about 66.5 nm. The n-type semiconductor layer 123 is formed of a nitride semiconductor having a broader band-gap than the active layer so as to allow light generated from the active layer to pass therethrough. When a GaN-based semiconductor layer is grown on a sapphire substrate 121, the n-type semiconductor layer 123 may generally include a plurality of layers to improve crystal quality.

A mesa M is disposed in some region on the n-type semiconductor layer 123. The mesa M includes the active layer 125 and the p-type semiconductor layer 127. Generally, the mesa M is formed by sequentially growing the n-type semiconductor layer 123, the active layer 125 and the p-type semiconductor layer 127, followed by patterning the p-type semiconductor layer 127 and the active layer 125 through mesa-etching.

The active layer 125 may have a single-quantum well structure or a multi-quantum well structure including well layers and barrier layers. The well layers are formed of AlGaN or AlInGaN and the barrier layers may be formed of AlGaN or AlInGaN having a broader band-gap than the well layers. For example, each of the well layers may be formed of AlGaN having an Al molar ratio of about 0.5 and have a thickness of about 3.1 nm, and each of the barrier layers may be formed of AlGaN having an Al molar ratio of about 0.7 or more and have a thickness of about 9 nm. In particular, the first barrier layer may have a thickness of 12 nm or more and may be formed to a greater thickness than other barrier layers. Each of the AlGaN layers adjoining upper and lower sides of each well layer and having a molar ratio of 0.7 to 0.8 may have a thickness of about 1 nm. Here, an AlGaN layer adjoining the last well layer may have an Al molar ratio of 0.8 or more in consideration of contact with an electron blocking layer.

The p-type semiconductor layer 127 may include the electron blocking layer and a p-type GaN contact layer. The electron blocking layer enhances recombination between electrons and holes by preventing overflow of electrons from the active layer to the p-type semiconductor layer. The electron blocking layer may be formed of, for example, a p-type AlGaN having an Al molar ratio of about 0.8 and may have a thickness of, for example, 55 nm. The p-type GaN contact layer may have a thickness of about 300 nm.

The mesa M includes a plurality of branches M1, M2, S1, S2, S3, and S4. For example, the mesa M may include main branches M1, M2 and sub-branches S1, S2, S3, S4. As shown well in FIG. 5, the mesa M may include a first main branch M1 extending along one side edge of the substrate 121 or the n-type semiconductor layer 123 and a second main branch M2 extending along another edge thereof adjacent to the one edge thereof. For example, the sub-branches S1, S2 may extend from the first main branch M1 and the sub-branches S3, S4 may extend from the second main branch M2. Although the main branch is illustrated as being composed of the first main branch M1 and the second main branch M2 for convenience of description, it should be noted that these main branches constitute a single main branch. The second main branch M2 may be omitted.

The sub-branches S1, S2, S3, and S4 may have different lengths and may be parallel to each other. In particular, the sub-branches S1, S2, S3, and S4 may be disposed parallel to a diagonal line of the substrate 121. As shown best in FIG. 5, the main branches M1, M2 and the sub-branches S1, S2, S3, and S4 are disposed over a broad region on the substrate 121. For example, the substrate 121 may have a quadrilateral shape having four edges, for example, a rectangular shape, and the shortest distance from each of the edges of the substrate 121 to the mesa M may be smaller than half the shortest distance from each of the edges of the substrate 121 to the center thereof.

Referring to FIG. 3, a minimum width W2 of the n-type semiconductor layer 123 exposed between the sub-branches S1, S2, S3, and S4 may be half or more a minimum width W1 of the sub-branches S1, S2, S3, and S4. Alternatively, the minimum width W2 of the n-type semiconductor layer 123 exposed between the sub-branches S1, S2, S3, and S4 may be greater than or equal to the minimum width W1 of the sub-branches S1, S2, S3, and S4. As compared with a conventional technique, the sub-branches S1, S2, S3, and S4 have a relatively small width and the width of the n-type semiconductor layer 123 exposed between the sub-branches S1, S2, S3, and S4 is relatively increased. With the structure wherein the sub-branches S1, S2, S3, and S4 are formed to have a relatively narrow width and to be disposed over a broad region of the substrate 121, the mesa M has an increased surface area on the side surface thereof.

The main branches M1, and M2 may have a greater width than the sub-branches S1, S2, S3, and S4, without being limited thereto. Alternatively, the width of the main branches M1, and M2 may be smaller than or equal to the width of the sub-branches S1, S2, S3, and S4.

Referring again to FIG. 1 and FIG. 2, the n-ohmic contact layer 129a is disposed on the n-type semiconductor layer 123 exposed around the mesa M. The n-ohmic contact layer 129a may be formed by depositing a plurality of metal layers, followed by alloying treatment of the metal layers through a rapid thermal alloying (RTA) process. For example, the n-ohmic contact layer 129a may be formed by sequentially depositing Cr/Ti/Al/Ti/Au, followed by alloying treatment, for example, at 935° C. within several to dozens of seconds by the RTA process. As a result, the n-ohmic contact layer 129a becomes an alloy layer containing Cr, Ti, Al, and Au.

The n-ohmic contact layer 129a surrounds the mesa M along the circumference of the mesa M. In addition, the n-ohmic contact layer 129a is interposed between the sub-branches S1, S2, S3, and S4. The n-ohmic contact layer 129a may be separated a constant distance from the mesa M and may be formed over most of the n-type semiconductor layer 123. The n-ohmic contact layer 129a is formed along the side surface of the mesa M such that a region free from the n-ohmic contact layer 129a is formed between the mesa M and the n-ohmic contact layer 129a. Light emitted through the side surface of the mesa M may reenter the n-type semiconductor layer 123 through this region and be discharged through the substrate 121. A separation distance between the n-ohmic contact layer 129a and the mesa M may be constant along the circumference of the mesa M, without being limited thereto.

After formation of the n-ohmic contact layer 129a, the p-ohmic contact layer 129b is formed on the mesa M. The p-ohmic contact layer 129b may be formed through, for example, RTA at about 590° C. for about 80 seconds after deposition of Ni/Au. The p-ohmic contact layer 129b forms ohmic contact with the p-type semiconductor layer 127 and covers most of an upper region of the mesa M, for example, 80% or more of the upper region thereof.

The n-pad metal layer 133a and the p-pad metal layer 133b are formed on the n-ohmic contact layer 129a and the p-ohmic contact layer 129b, respectively. The n-pad metal layer 133a and the p-pad metal layer 133b may be simultaneously formed of the same metals by the same process. For example, each of the n- and p-pad metal layers 133a, and 133b may include a Ti layer (300 Å)/Au layer (7,000 Å)/Ti layer (50 Å).

A conventional technique requires a step adjustment layer under the n-bump in order to allow thermal-sonic bonding, whereas exemplary embodiments of the inventive concepts employ solder pastes or AuSn bonding and thus do not require the step adjustment layer. Accordingly, the n-pad metal layer 133a may directly adjoin the n-ohmic contact layer 129a.

Referring to FIG. 2A, the n-pad metal layer 133a and the p-pad metal layer 133b are disposed on the n-ohmic contact layer 129a and the p-ohmic contact layer 129b through the same areas as the n-ohmic contact layer 129a and the p-ohmic contact layer 129b, respectively, but are not limited thereto. Alternatively, the n-pad metal layer 133a and the p-pad metal layer 133b may be disposed thereon through smaller areas than the n-ohmic contact layer 129a and the p-ohmic contact layer 129b, respectively. Alternatively, referring to FIG. 2B, the n-pad metal layer 133a and the p-pad metal layer 133b may cover upper and side surfaces of the n-ohmic contact layer 129a and the p-ohmic contact layer 129b, respectively. In the structure wherein the n and p-pad metal layers 133a, 133b cover not only the upper surfaces of the n and p-ohmic contact layers 129a, and 129b, but also side surfaces thereof, respectively, the n and p-ohmic contact layers 129a, and 129b can be efficiently protected from solders during soldering or AuSn bonding.

The insulation layer 135 covers the n-pad metal layer 133a and the p-pad metal layer 133b. The insulation layer 135 has an opening 135a that exposes the n-pad metal layer 133a, and an opening 135b that partially exposes the p-pad metal layer 133b above the mesa M. The opening 135a overlaps the n-ohmic contact layer 129a and the opening 135b overlaps the p-ohmic contact layer 129b. The opening 135a and the opening 135b may be disposed near opposite edges.

The n-bump 137a covers the opening 135a and is connected to the n-pad metal layer 133a through the opening 135a. The n-bump 137a is electrically connected to the n-type semiconductor layer 123 through the n-pad metal layer 133a and the n-ohmic contact layer 129a.

The p-bump 137b covers the opening 135b and is connected to the p-pad metal layer 133b through the opening 135b. The p-bump 137b is electrically connected to the p-type semiconductor layer 127 through the p-pad metal layer 133b and the p-ohmic contact layer 129b.

The n-bump 137a and the p-bump 137b may be formed of, for example, Ti/Au/Cr/Au. The n-bump 137a and the p-bump 137b may be disposed parallel to each other, as shown in FIG. 1. The openings 135a, and 135b are shielded by the n-bump 137a and the p-bump 137b to prevent external moisture or solders from entering through the openings 135a, and 135b, thereby improving reliability.

Meanwhile, each of the n-bump 137a and the p-bump 137b may partially cover the side surface of the mesa M. The n-bump 137a and the p-bump 137b have reflectivity with respect to UV light and thus can reflect light emitted through the side surface of the mesa M so as to allow the light to reenter the mesa M.

In the meantime, as shown in FIG. 2A, upper surfaces of the n-bump 137a and the p-bump 137b may not be flush with each other due to a height difference between the mesa M and the n-pad metal layer 133a.

The anti-reflection layer 139 is disposed on a light exit surface of the substrate 121. The anti-reflection layer 139 may be formed of a transparent insulation material such as $SiO_2$ and may be formed to a thickness, for example, integer times ¼ an ultraviolet wavelength. Alternatively, the anti-reflection layer 139 may be a band pass filter formed by repeatedly stacking layers having different indices of refraction.

Figure 4:
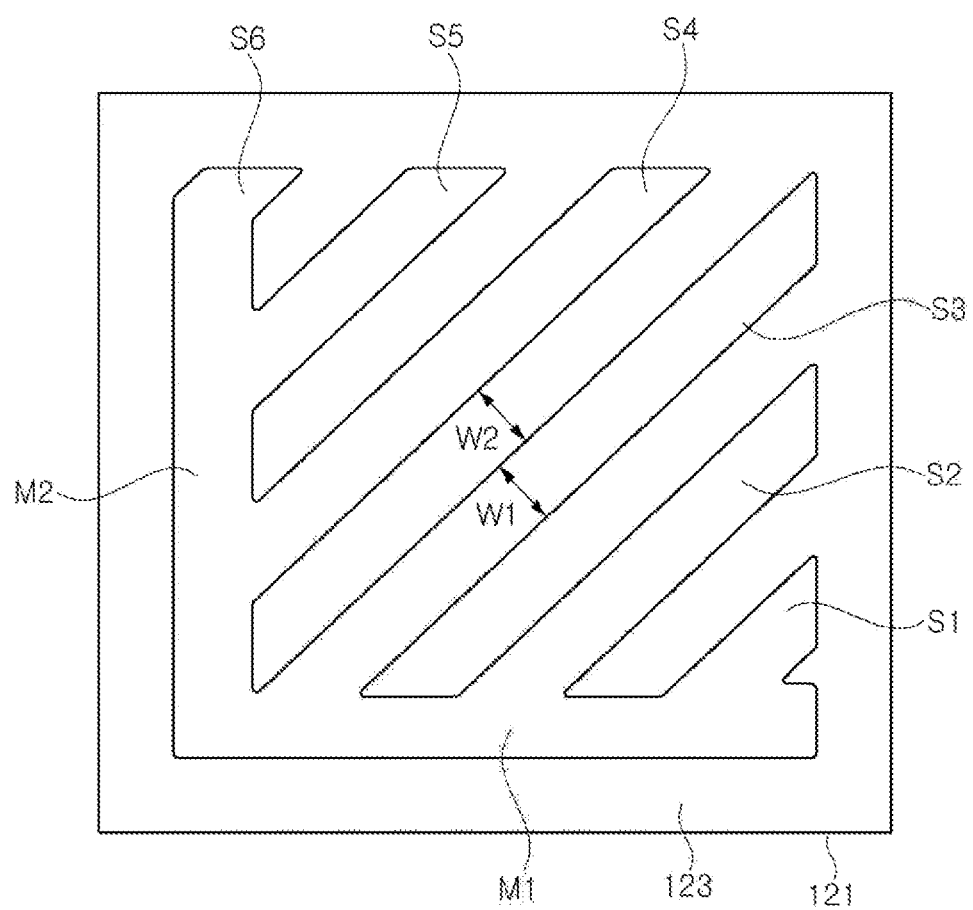
FIG. 4 is a schematic plan view of a UV light emitting diode according to another exemplary embodiment.

FIG. 4 is a schematic plan view of a UV light emitting diode according to another exemplary embodiment of the inventive concepts.

Referring to FIG. 4, a light emitting diode according to this exemplary embodiment is substantially similar to the light emitting diode according to the above exemplary embodiment except that a greater number of sub-branches S1 to S6 is used. As the number of sub-branches S1 to S6 increases, the widths of the sub-branches S1 to S6 are further reduced. The sub-branches S1 to S6 may have a similar width and a minimum width W1 of the sub-branches S1 to S6 may be two times or less of a minimum width W2 of the n-type semiconductor layer 123 exposed between the sub-branches. Furthermore, the minimum width W1 of the sub-branches S1 to S6 may be smaller than or equal to the minimum width W2 of the n-type semiconductor layer 123 exposed between the sub-branches. Meanwhile, the main branches M1, and M2 may have a greater width than the sub-branches S1 to S6, without being limited thereto. Alternatively, the width of the main branches M1, and M2 may be smaller than or equal to the width of the sub-branches S1 to S6.

Since the light emitting diode according to this exemplary embodiment is substantially similar to the light emitting diode according to the above exemplary embodiment excluding the shape of the mesa M, detailed description thereof will be omitted to avoid repetition and the light emitting diode according to this exemplary embodiment is schematically shown.

Figure 5:
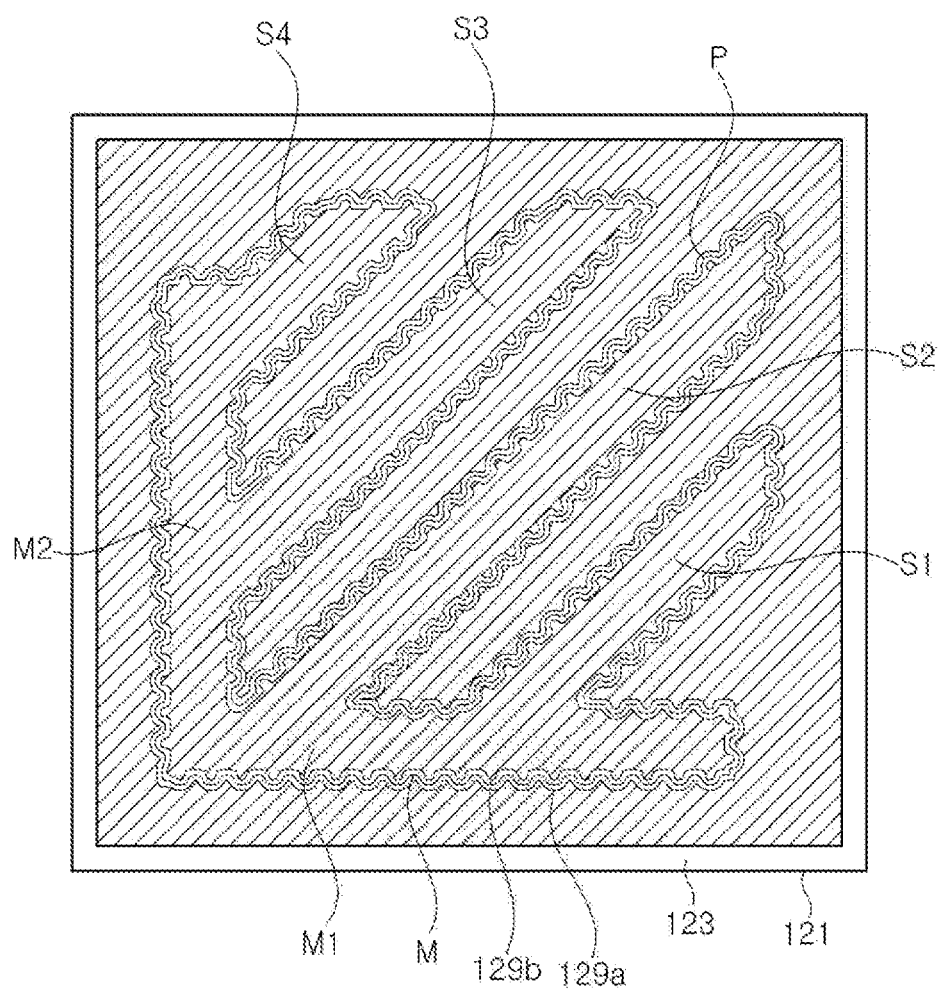
FIG. 5 is a schematic plan view of a UV light emitting diode according to a further exemplary embodiment.

FIG. 5 is a schematic plan view of a UV light emitting diode according to a further exemplary embodiment of the inventive concepts.

Referring to FIG. 5, a light emitting diode according to this exemplary embodiment is substantially similar to the light emitting diode described with reference to FIG. 1 to FIG. 3 except for protrusions P formed on the side surface of the mesa M. The protrusions P may be formed together with the mesa M upon mesa-etching to form the mesa M.

The protrusions P formed on the side surface of the mesa M increase the surface area on the side surface of the mesa M.

Meanwhile, the n-ohmic contact layer 129a may be separated a constant distance from the side surface of the mesa M. Thus, depressions are formed corresponding to the protrusions P along the contour of the side surface of the mesa M. The p-ohmic contact layer 129b may also be formed to have protrusions along the contour of the side surface of the mesa M.

Figure 6:
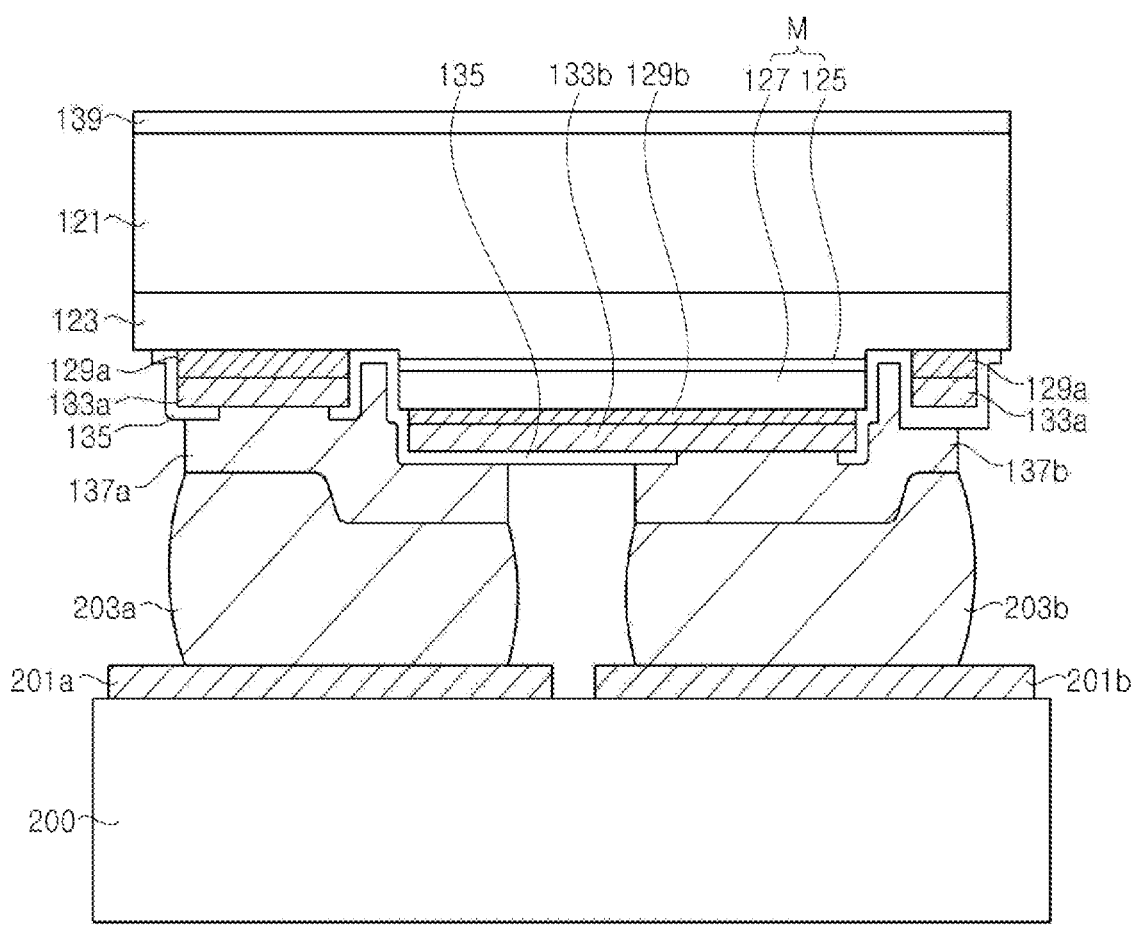
FIG. 6 is a schematic sectional view of the UV light emitting diode according to the exemplary embodiment, which is mounted on a submount.

FIG. 6 is a schematic sectional view of the UV light emitting diode according to the exemplary embodiment of the inventive concepts, which is mounted on a submount.

Referring to FIG. 6, the UV light emitting diode is flip-bonded to a submount substrate 200. The submount substrate 200 may have electrode pads 201a, 201b on an insulating substrate, for example, AlN.

The n-bump 137a and the p-bump 137b may be bonded to the electrode pads 201a, 201b of the submount substrate 200 through solder pastes 203a, and 203b. Since the UV light emitting diode is bonded to the submount substrate through the solder pastes 203a and 203b, the upper surfaces of the n-bump 137a and the p-bump 137b are not required to be flush with each other as in typical thermal sonic bonding.

Although bonding is performed using the solder pastes in this exemplary embodiment, the UV light emitting diode may be bonded to the submount substrate 200 through soldering using AuSn.

Exemplary embodiments of the inventive concepts provide a light emitting diode, in which an n-bump and a p-bump cover a side surface of a mesa to reflect UV light on the side surface of the mesa. Accordingly, the light emitting diode can reduce loss of UV light emitted through the side surface of the mesa. Furthermore, the light emitting diode includes a plurality of branches to increase a surface area of the side surface of the mesa, whereby a light reentering region between the side surface of the mesa and the n-ohmic contact layer can be increased to allow some of UV light emitted through the side surface of the mesa to reenter a substrate.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An ultraviolet (UV) light emitting diode comprising:
a substrate;
an n-type semiconductor layer disposed on the substrate;
a mesa disposed on the n-type semiconductor layer and including an active layer and a p-type semiconductor layer;
an n-ohmic contact layer contacting the n-type semiconductor layer;
a p-ohmic contact layer contacting the p-type semiconductor layer;
an n-bump electrically connected to the n-ohmic contact layer; and
a p-bump electrically connected to the p-ohmic contact layer,
wherein the mesa includes a main branch region and a sub-branch region extended from the main branch region,
the n-ohmic contact layer surrounds the mesa,
the n-bump covers a region of an upper surface and a region of a side surface of the mesa,
the p-bump covers another region of the upper surface and another region of the side surface of the mesa,
the p-bump covers the main branch region, and
the region of the side surface of the mesa is connected to the another region of the side surface of the mesa.

2. The UV light emitting diode of claim 1, wherein a shortest distance from an edge of the substrate to the mesa is less than half of a shortest distance from an edge of the substrate to a center of the substrate.

3. The UV light emitting diode of claim 1, wherein the n-bump and the p-bump are disposed parallel to each other.

4. The UV light emitting diode of claim 1, wherein upper surfaces of the n-bump and the p-bump have different heights and are not flush with each other.

5. The UV light emitting diode of claim 1, further comprising:

an n-pad metal layer contacting the n-ohmic contact layer;
a p-pad metal layer contacting the p-ohmic contact layer; and
an insulation layer covering the n-pad metal layer and the p-pad metal layer,
wherein the insulation layer has a first opening that partially exposes the n-pad metal layer, and a second opening that partially exposes the p-pad metal layer.

6. The UV light emitting diode of claim 1, wherein the n-ohmic contact layer is formed by depositing a plurality of metal layers, and the n-ohmic contact layer surrounds the mesa and is separated from the mesa.

7. The UV light emitting diode of claim 5, wherein the n-pad metal layer and the p-pad metal layer are formed of same metals.

8. An ultraviolet (UV) light emitting diode comprising:
a substrate;
an n-type semiconductor layer disposed on the substrate;
a mesa disposed on the n-type semiconductor layer and including an active layer and a p-type semiconductor layer;
an n-ohmic contact layer contacting the n-type semiconductor layer;
a p-ohmic contact layer contacting the p-type semiconductor layer;
an n-bump electrically connected to the n-ohmic contact layer; and
a p-bump electrically connected to the p-ohmic contact layer,
wherein the mesa includes a main branch region and a sub-branch region extended from the main branch region,
the n-ohmic contact layer surrounds the mesa,
the n-bump covers a region of an upper surface and a region of a side surface of the mesa,
the p-bump covers another region of the upper surface and another region of the side surface of the mesa,
the n-bump covers the sub-branch region, and
the region of the side surface of the mesa is connected to the another region of the side surface of the mesa.

9. The UV light emitting diode of claim 8, wherein a shortest distance from an edge of the substrate to the mesa is less than half of a shortest distance from an edge of the substrate to a center of the substrate.

10. The UV light emitting diode of claim 8, wherein the n-bump and the p-bump are disposed parallel to each other.

11. The UV light emitting diode of claim 8, wherein upper surfaces of the n-bump and the p-bump have different heights and are not flush with each other.

12. The UV light emitting diode of claim 8, further comprising:
an n-pad metal layer contacting the n-ohmic contact layer;
a p-pad metal layer contacting the p-ohmic contact layer; and
an insulation layer covering the n-pad metal layer and the p-pad metal layer,
wherein the insulation layer has a first opening that partially exposes the n-pad metal layer, and a second opening that partially exposes the p-pad metal layer.

13. The UV light emitting diode of claim 8, wherein the n-ohmic contact layer is formed by depositing a plurality of metal layers, and the n-ohmic contact layer surrounds the mesa and is separated from the mesa.

14. The UV light emitting diode of claim 12, wherein the n-pad metal layer and the p-pad metal layer are formed of same metals.

15. An ultraviolet (UV) light emitting device comprising:
a mount substrate;
electrode pads connected to the mount substrate; and
a UV light emitter electrically connected to the electrode pads,
wherein the UV light emitter includes:
an n-type semiconductor layer,
a mesa disposed under the n-type semiconductor layer and including an active layer and a p-type semiconductor layer;
an n-ohmic contact layer contacting the n-type semiconductor layer;
a p-ohmic contact layer contacting the p-type semiconductor layer;
an n-bump electrically connected to the n-ohmic contact layer; and
a p-bump electrically connected to the p-ohmic contact layer,
wherein the mesa includes a main branch region and a sub-branch region extended from the main branch region,
the n-ohmic contact layer surrounds the mesa,
the n-bump covers a region of an upper surface and a region of a side surface of the mesa,
the p-bump covers another region of the upper surface and another region of the side surface of the mesa,
the p-bump covers the main branch region, and
the region of the side surface of the mesa is connected to the another region of the side surface of the mesa.

16. The UV light emitting device of claim 15, wherein a shortest distance from an edge of the mount substrate to the mesa is less than half of a shortest distance from an edge of the mount substrate to a center of the mount substrate.

17. The UV light emitting device of claim 15, wherein the n-bump and the p-bump are disposed parallel to each other.

18. The UV light emitting device of claim 15, further comprising:
an n-pad metal layer contacting the n-ohmic contact layer;
a p-pad metal layer contacting the p-ohmic contact layer;
an insulation layer covering the n-pad metal layer and the p-pad metal layer,
wherein the insulation layer has a first opening that partially exposes the n-pad metal layer, and a second opening that partially exposes the p-pad metal layer.

19. The UV light emitting device of claim 15, wherein the n-ohmic contact layer is formed by depositing a plurality of metal layers, and the n-ohmic contact layer surrounds the mesa and is separated from the mesa.

20. The UV light emitting device of claim 18, wherein the n-pad metal layer and the p-pad metal layer are formed of same metals.

* * * * *